United States Patent
Jung

(10) Patent No.: US 9,513,669 B2
(45) Date of Patent: Dec. 6, 2016

(54) FOLDABLE DISPLAY DEVICE

(71) Applicant: SAMSUNG DISPLAY CO., LTD., Yongin, Gyeonggi-Do (KR)

(72) Inventor: Woo-Hyun Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 152 days.

(21) Appl. No.: 14/479,253

(22) Filed: Sep. 5, 2014

(65) Prior Publication Data
US 2015/0286253 A1 Oct. 8, 2015

(30) Foreign Application Priority Data
Apr. 8, 2014 (KR) .................... 10-2014-0041708

(51) Int. Cl.
*G06F 1/16* (2006.01)

(52) U.S. Cl.
CPC ........... *G06F 1/1652* (2013.01); *G06F 1/1632* (2013.01); *G06F 1/1643* (2013.01)

(58) Field of Classification Search
CPC .... G06F 1/1613; G06F 1/1632; G06F 1/1633; G06F 1/1637; G06F 1/1641; G06F 1/1643; G06F 1/1652; G06F 1/1654; G06F 1/1656–1/166; G06F 3/033; G06F 3/0354; G06F 3/03545; G06F 3/041; G06F 3/0412; G06F 2200/1632; G06F 2203/04102; G09G 3/32–3/3291; G09G 2300/02; G09G 2300/023
See application file for complete search history.

(56) References Cited

U.S. PATENT DOCUMENTS

| | | | |
|---|---|---|---|
| 7,249,324 B2* | 7/2007 | Nakamura | G06F 1/1616 345/1.1 |
| 2004/0070633 A1 | 4/2004 | Nakamura et al. | |
| 2007/0146307 A1* | 6/2007 | Kuo | G02F 1/167 345/107 |
| 2011/0227822 A1* | 9/2011 | Shai | G06F 1/1615 345/156 |
| 2013/0169515 A1* | 7/2013 | Prushinskiy | G06F 1/1652 345/55 |

FOREIGN PATENT DOCUMENTS

| | | |
|---|---|---|
| JP | 2001-312227 A | 11/2001 |
| JP | WO02/056284 A1 | 7/2002 |
| JP | 2009-098504 A | 5/2009 |

* cited by examiner

*Primary Examiner* — Nathan Danielsen
(74) *Attorney, Agent, or Firm* — Lewis Roca Rothgerber Christie LLP

(57) ABSTRACT

A display device includes: a display substrate configured to be folded along a folding line; a driver detachably coupled to the display substrate; and a pad on at least one surface of the display substrate, the pad being configured to transmit a plurality of signals received from the driver to the display substrate, wherein the driver comprises an integrated circuit configured to supply the signals, a coupling portion configured to couple the driver to the display substrate, and a connector configured to couple the pad and the integrated circuit to each other.

18 Claims, 14 Drawing Sheets

FOLDABLE DISPLAY DEVICE

CROSS-REFERENCE TO RELATED APPLICATION

This application claims priority to and the benefit of Korean Patent Application No. 10-2014-0041708, filed on Apr. 8, 2014, with the Korean Intellectual Property Office, the disclosure of which is incorporated herein in its entirety by reference.

BACKGROUND

1. Field

Embodiments of the present invention relate to a display device.

2. Description of Related Technology

Recently, flexible display devices which can be bent have been developed. The flexible display device can be utilized in a folded or curved state, and can be used in various applications. In a flexible display device, display elements are arranged on a flexible substrate.

There are various kinds of display devices such as, for example, organic light emitting diode (OLED) displays, liquid crystal displays (LCDs), or electrophoretic displays (EPDs). Among these, the OLED display is drawing attention as a display element for a flexible display device because it can be manufactured to have a thin film laminated structure, which in turn provides flexibility.

Flexible display devices are classified into three types: a rollable display that can be rolled up into a scroll; a foldable display that can be folded like a sheet of paper; and a stretchable display that can increase or decrease in size, in accordance with the degree of bend.

Among these, the foldable display has characteristics of being portable while being in a folded state and of having (e.g., realizing) a large-area display while being in an unfolded state.

It is to be understood that this background of the technology section is intended to provide useful background for understanding the herein disclosed technology and as such, the technology background section may include ideas, concepts or recognitions that were not part of what was known or appreciated by those of ordinary skill in the pertinent art prior to corresponding effective filing dates of subject matter disclosed herein.

SUMMARY

Aspects of embodiments of the present invention are directed toward a display device including a display substrate that can be folded along a folding line and a driving unit (or driver) that is detachably coupled to the display substrate, thereby being portable and providing (or realizing) a large area.

According to an aspect of the present invention, there is provided a display device including: a display substrate configured to be folded along a folding line; a driver detachably coupled to the display substrate; and a pad on at least one surface of the display substrate, the pad being configured to transmit a plurality of signals received from the driver to the display substrate, wherein the driver includes an integrated circuit configured to supply the signals, a coupling portion configured to couple the driver to the display substrate, and a connector configured to couple the pad and the integrated circuit to each other.

The pad may include pads on respective surfaces of the display substrate.

The pad may be at a vicinity of a folding line of the display substrate.

The connector may be at at least one end portion of the coupling portion.

The connector may be at a central portion of the coupling portion.

The display substrate may be configured to be folded along the folding line so as to be coupled to the coupling portion.

The pad may be coupled to the connector at an end portion of the coupling portion when the display substrate is coupled to the coupling portion while being in a folded state.

The pad may be coupled to the connector at a central portion of the coupling portion when the display substrate is coupled to the coupling portion while being in an unfolded state.

The display device may further include a motion sensor at at least one edge of the display substrate.

The motion sensor may include a bending motion sensor configured to detect whether or not the display substrate is bent.

The display substrate may include a dual emission structure.

The display substrate may include an organic light emitting diode.

The driver may further include at least one of an on/off switch, a camera, a communication device, a speaker, or an earphone hole.

The display device may further include a stylus pen configured to be detached from the driver.

The folding line may be at a central portion of the display substrate.

The display device may further include a docking station configured to detach from the driver and configured to charge the driver.

The docking station may be coupled to at least one side of the display substrate.

The display device may further include a carrying case coupled to the docking station.

The display substrate may be configured to be inserted into the carrying case.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other aspects, features and other enhancements of the present invention will be more clearly understood from the following detailed description when taken in conjunction with the accompanying drawings, in which.

DETAILED DESCRIPTION

Figure 1:
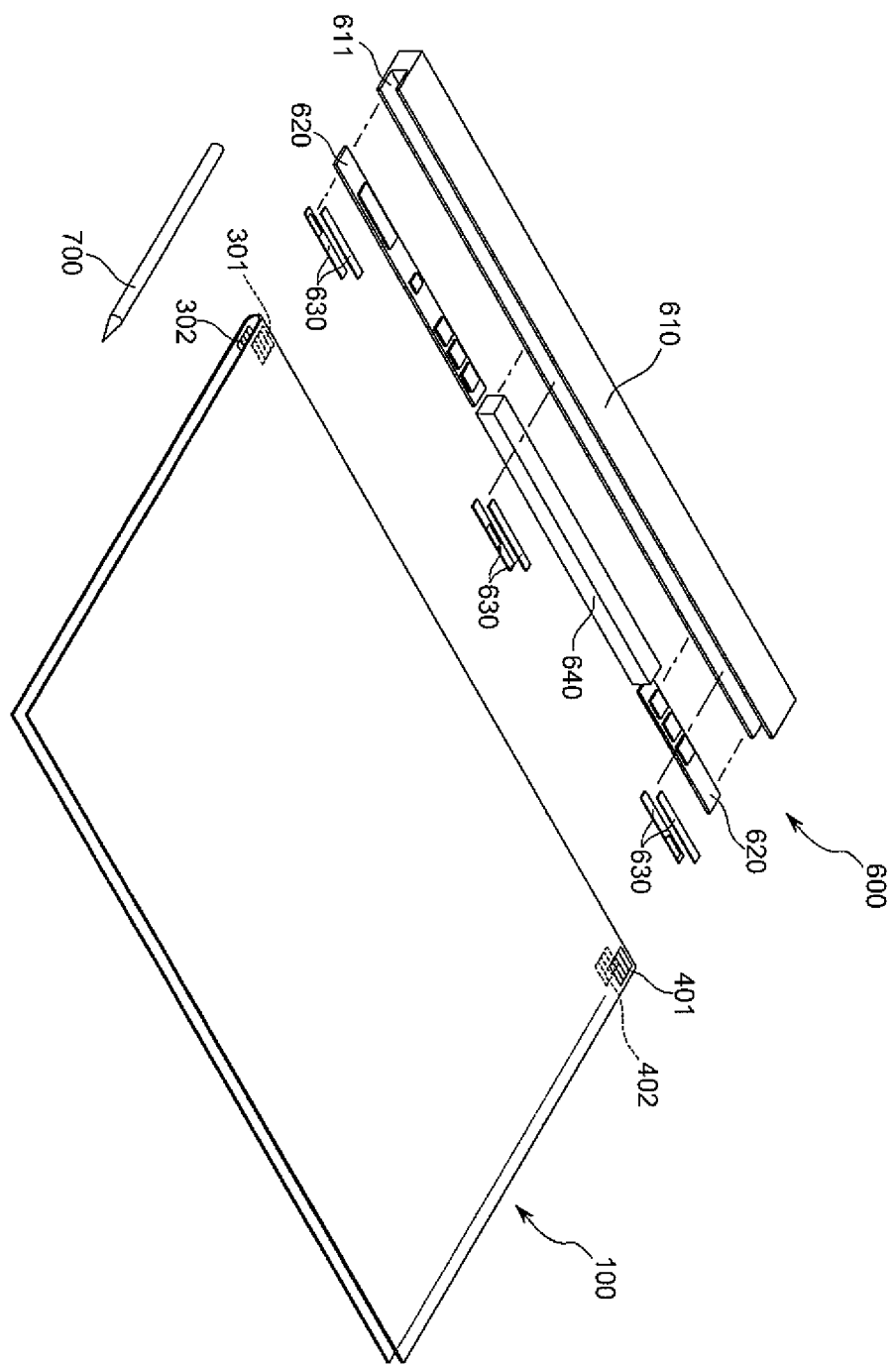
FIG. 1 is a perspective view illustrating a display device according to one embodiment of the present invention.

Embodiments of the present invention will now be described in detail with reference to the accompanying drawings. The present invention may, however, be embodied in many different forms and should not be construed as being limited to the embodiments set forth herein. Rather, these embodiments are provided for thoroughness and completeness of the disclosure, and will fully convey the scope of the present invention to those skilled in the art.

In the drawings, certain elements or shapes may be simplified or exaggerated to better illustrate embodiments of the present invention, and other elements present in an actual product or other embodiments may also be omitted. Thus, the drawings are intended to facilitate the understanding of the present invention. Like reference numerals refer to like elements throughout the specification.

In addition, when a layer or element is referred to as being "on" another layer or element, the layer or element may be directly on the other layer or element, or one or more intervening layers or elements may be interposed therebetween. Further, the use of "may" when describing embodiments of the present invention refers to "one or more embodiments of the present invention."

When a first element is described as being "coupled" or "connected" to a second element, the first element may be directly "coupled" or "connected" to the second element, or one or more other intervening elements may be located between the first element and the second element.

FIG. 1 is a perspective view illustrating a display device according to one embodiment of the present invention.

Referring to FIG. 1, a display device according to one embodiment includes a display substrate 100 including a display area and a non-display area, and a driving unit (or driver) 600 configured to drive the display substrate 100. A stylus pen 700 may be further included with the display device.

The display device according to one embodiment may be a flexible display device or a foldable display device that can be folded along a folding line.

With continued reference to FIG. 1, the display substrate 100 is folded to be bilaterally symmetric with respect to a folding line, but embodiments of the present invention are not limited thereto. The display substrate 100 may be a transparent display device. The display substrate may be a dual emission structure. The display substrate 100 may include a touch screen panel on one surface thereof. The display substrate 100 may include at least one pad (e.g., pad unit) 301, 302, 401, and 402 on one surface and/or the other surface thereof. A detailed configuration of the display substrate 100 will be fully described below with reference to FIGS. 2 and 5.

The driving unit 600 may include a body 610 mechanically coupled to the display substrate 100, a data driver integrated circuit 620 configured to supply a plurality of signals and voltages to drive the display substrate 100, and a connector 630 configured to electrically couple the data driver integrated circuit 620 and the pad units 301, 302, 401, and 402.

The driving unit 600 may further include a power supply source 640 configured to supply power, and the driving unit 600 may further include at least one of an on/off switch, a camera, a communication device, a speaker, and an earphone hole.

The body 610 may include a slotted coupling portion 611 that is coupled to the display substrate 100. The data driver integrated circuit 620 may be disposed on an inner side of the coupling portion 611. The connector 630 may be disposed on both end portions of an inner side of the coupling portion 611 and a central portion thereof, but embodiments of the present invention are not limited thereto. The location of the connector 630 may vary depending on positions of the pad units 301, 302, 401, and 402.

Figure 2:
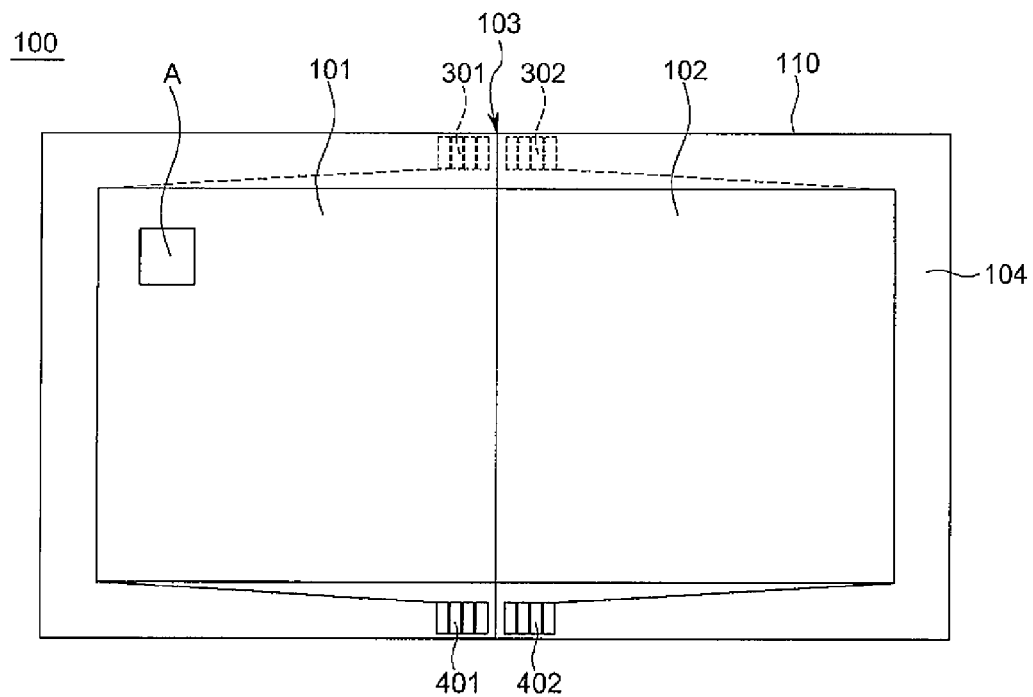
FIGS. 2 and 3 are plan views illustrating a display substrate of a display device according to one embodiment of the present invention.
Figure 3:
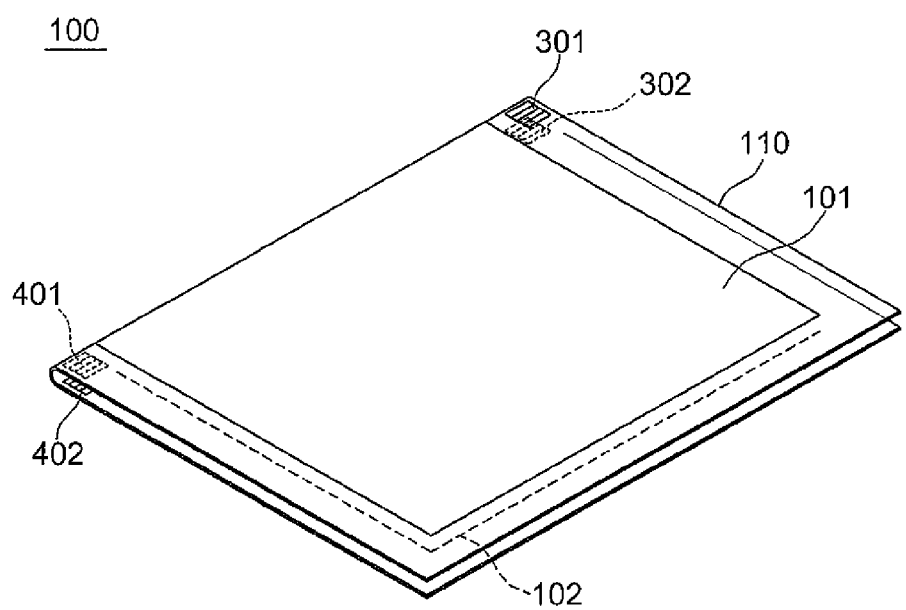

FIGS. 2 and 3 are plan views illustrating a display substrate of a display device according to one embodiment of the present invention. For example, FIG. 2 is a view illustrating an unfolded display substrate 100 and FIG. 3 is a view illustrating a folded display substrate 100.

Referring to FIGS. 2 and 3, the display substrate 100 may be folded inwards or outwards with respect to a folding line 103.

The display substrate 100 may include a substrate body 110 including display areas 101 and 102 and a non-display area 104. The display areas 101 and 102 may be divided into two areas: a first display area 101 and a second display area 102, with respect to the folding line 103.

The first and second display areas 101 and 102 are an image displaying area divided based on the folding line 103 for ease of description. Therefore, the first and second display areas 101 and 102 may be substantially one image displaying area or two divided image displaying areas. A plurality of pixels are disposed in the first and second display areas 101 and 102 such that images are displayed. The folding line 103 may be formed at a central portion of the display substrate 100, but embodiments of the present invention are not limited thereto.

The pad units 301, 302, 401, and 402 may be disposed at the non-display area 104. The pad units 301, 302, 401, and 402 may be electrically coupled to a driving unit that will be described below so as to transmit a plurality of signals and voltages received from the driving unit to each pixel. The position of the pad units 301, 302, 401, and 402 may not be limited, but the pad units 301, 302, 401, and 402 may be located to be adjacent to the folding line 103 in consideration of being mechanically coupled to the driving unit.

Further, the pad units 301, 302, 401, and 402 may be disposed on one surface and/or the other surface of the display substrate 100.

Referring to FIG. 2, the pad units 301 and 401 disposed on one surface and the other surface of the display substrate 100 may transmit a plurality of signals and voltages to the first display area 101, and the pad units 302 and 402 disposed on one surface and the other surface of the display substrate 100 may transmit a plurality of signals and voltages to the second display area 102.

In FIGS. 2 and 3, the pad units 301, 302, 401, and 402 are respectively separated from each other. However, the pad units 301 and 302 disposed on one surface of the display substrate 100 may be one pad unit that is physically coupled to each other. The pad units 401 and 402 disposed on the other surface of the display substrate 100 may also be one pad unit that is physically coupled to each other.

Coupling lines may be disposed between the respective pad units 301, 302, 401, and 402 and the first and second display areas 101 and 102 in order to couple the respective pad units 301, 302, 401, and 402 to each pixel.

Figure 4:
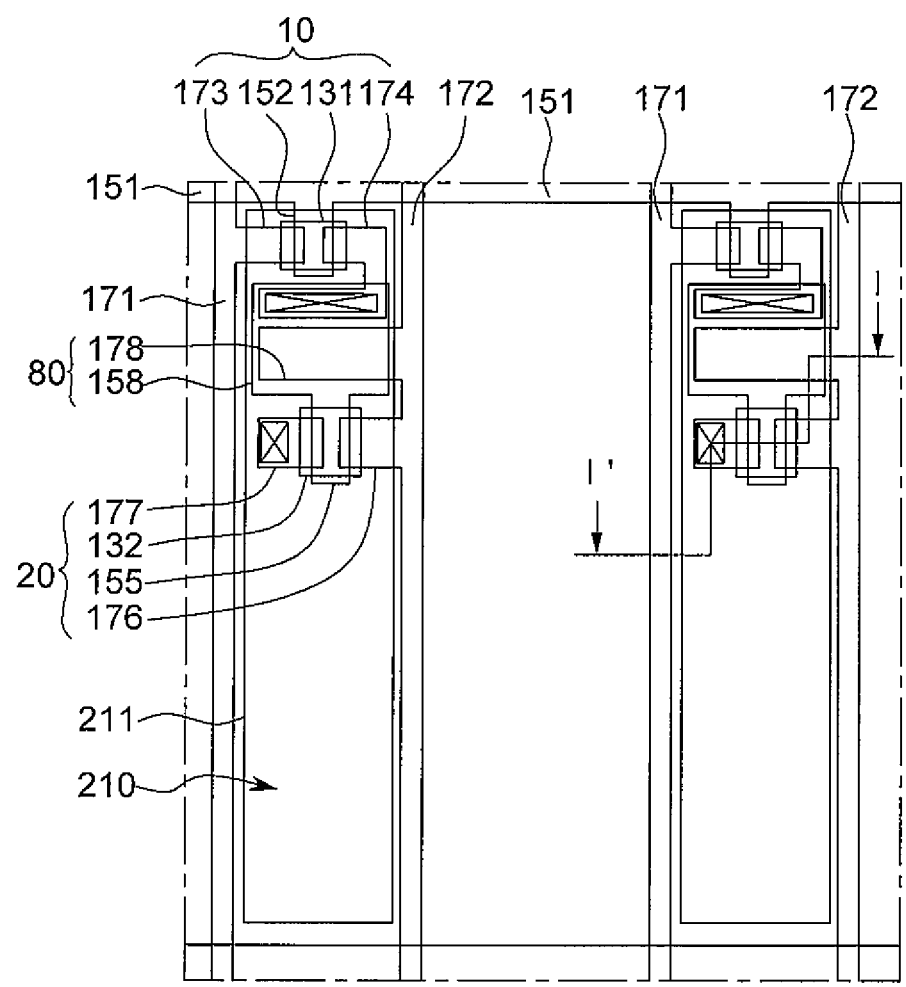
FIG. 4 is a partially enlarged view illustrating the "A" part shown in FIG. 2.
Figure 5:
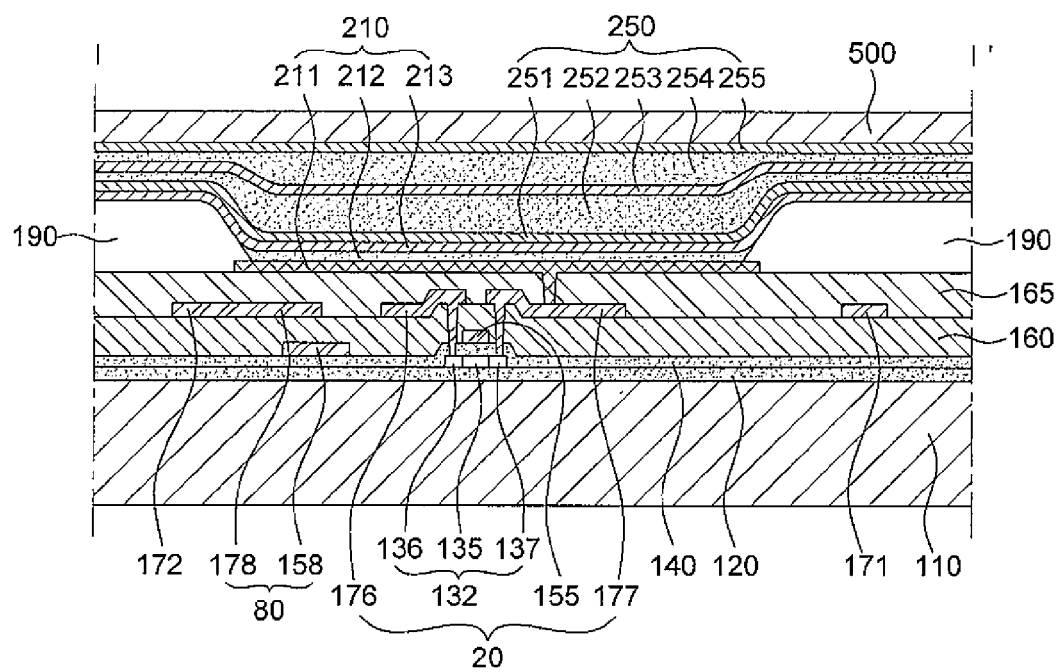
FIG. 5 is a cross-sectional view taken along the line I-I' shown in FIG. 4.

FIG. 4 is a partially enlarged view illustrating the "A" part shown in FIG. 2. FIG. 5 is a cross-sectional view taken along the line I-I' shown in FIG. 4.

Referring to FIGS. 4 and 5, the display substrate 100 according to one embodiment may include a plurality of pixels including a switching thin film transistor (TFT) 10, a driving TFT 20, a capacitor 80, and an organic light emitting diode (OLED) 210. The OLED 210 can be deposited at a relatively low temperature and has characteristics of low power consumption and high luminance, and thus can be often applied to flexible display devices. Herein, the pixel refers to the smallest unit for displaying an image, and the display substrate 100 displays an image utilizing a plurality of pixels.

Although two TFTs 10 and 20 and a capacitor 80 are included in one pixel with reference to FIGS. 4 and 5, embodiments of the present invention are not limited thereto. One pixel may include three or more TFTs and two or more capacitors, and may further include lines, and thus may have many different structures.

The display substrate 100 may include a gate line 151 on the substrate body 110, a data line 171 insulated from and crossing the gate line 151, and a common power line 172. In general, one pixel is defined by the gate line 151, the data line 171, and the common power line 172, but may be differently defined. For example, the pixel may be defined by a black matrix or a pixel defining layer (PDL).

The substrate body 110 may be made of a flexible material such as plastic. In one embodiment, the substrate body 110 may be made of any one material selected from Kapton®, polyethersulphone (PES), polycarbonate (PC), polyimide (PI), polyethyleneterephthalate (PET), polyethylenenaphthalate (PEN), polyacrylate (PAR), and/or fiber reinforced plastic (FRP).

The substrate body 110 may have a thickness in a range of about 5 μm to about 200 μm. In the case where the thickness of the substrate body 110 is less than 5 μm, the substrate body 110 may be difficult to stably support the OLED 210. On the other hand, in the case where the thickness of the substrate body 110 is 200 μm or greater, the substrate body 110 may have poor flexibility.

A buffer layer 120 may be disposed on the substrate body 110. The buffer layer 120 may serve to reduce (e.g., prevent) infiltration of undesirable elements, such as impurities, may planarize a surface of the substrate body 110, and may be made of various different materials suitable for performing such functions. For example, the buffer layer 120 may be made of any one selected from silicon nitride ($SiN_x$), silicon oxide ($SiO_2$), and/or a silicon oxynitride ($SiO_xN_y$). However, the buffer layer 120 is not always necessary and may not be provided according to the kinds and/or process conditions of the substrate body 110.

A switching semiconductor layer 131 and a driving semiconductor layer 132 may be disposed on the buffer layer 120. The switching and driving semiconductor layers 131 and 132 may be made of any one selected from a polycrystalline silicon layer, an amorphous silicon layer, and/or an oxide semiconductor, such as indium gallium zinc oxide (IGZO) and/or indium zinc tin oxide (IZTO). For instance, when the driving semiconductor layer 132 illustrated in FIG. 5 is made of the polycrystalline silicon layer, the driving semiconductor layer 132 may include a channel area 135 that is not doped with impurities and p+ doped source and drain areas 136 and 137 on the respective sides of the channel area 135. In one embodiment, p-type impurities, such as boron (B), are used as dopant ions and $B_2H_6$ is generally used. Such impurities vary depending on the kinds of thin film transistors (TFTs). According to one embodiment, a PMOS-structured TFT using the p-type impurities is used as the driving TFT 20, but embodiments of the present invention are not limited thereto. An NMOS-structured or CMOS-structured TFT may also be used as the driving TFT 20.

A gate insulating layer 140 may be disposed on the switching and driving semiconductor layers 131 and 132. The gate insulating layer 140 may include at least one selected from tetraethyl orthosilicate (TEOS), silicon nitride ($SiN_x$), and/or silicon oxide ($SiO_2$). For instance, the gate insulating layer 140 may have, but is not limited to having, a double layer structure in which a silicon nitride layer having a thickness of about 40 nm and a TEOS layer having a thickness of about 80 nm are sequentially laminated.

A gate wire including gate electrodes 152 and 155 may be disposed on the gate insulating layer 140. The gate wire may further include a gate line 151, a first capacitor plate 158, and other wires. The gate electrodes 152 and 155 may be located to overlap at least a part of the semiconductor layers 131 and 132 and, for example, to overlap the channel area 135. The gate electrodes 152 and 155 may reduce (e.g., prevent) doping with impurities of the channel area 135 when the source and drain areas 136 and 137 of the semiconductor layers 131 and 132 are doped with the impurities in the process of forming the semiconductor layers 131 and 132.

The gate electrodes 152 and 155 and the first capacitor plate 158 may be disposed on the same layer and may be made of substantially the same metal material. In one embodiment, the metal material may include at least one selected from molybdenum (Mo), chromium (Cr), and/or tungsten (W).

An interlayer insulating layer 160 configured to cover the gate electrodes 152 and 155 may be disposed on the gate insulating layer 140. The interlayer insulating layer 160 may be made of, but not limited to, tetraethyl orthosilicate (TEOS), silicon nitride ($SiN_x$), or silicon oxide ($SiO_x$) similar to the gate insulating layer 140.

A data wire including source electrodes 173 and 176 and drain electrodes 174 and 177 may be disposed on the interlayer insulating layer 160. The data wire may further include a data line 171, a common power line 172, a second capacitor plate 178, and other wires. The source electrodes 173 and 176 and drain electrodes 174 and 177 may be respectively coupled to the source area 136 and the drain area 137 of the semiconductor layers 131 and 132 through a contact hole of the gate insulating layer 140 and the interlayer insulating layer 160.

Thus, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. The configuration of the TFTs 10 and 20 is not limited to the above-described embodiment and may vary according to suitable known configurations that can be carried out by those skilled in the art.

The capacitor 80 includes the first and second capacitor plates 158 and 178. In one embodiment, the interlayer insulating layer 160 is interposed between the first and second capacitor plates 158 and 178.

The switching TFT 10 acts as a switching element configured to select a pixel to emit light. The switching gate electrode 152 is coupled to the gate line 151. The switching source electrode 173 is coupled to the data line 171. The switching drain electrode 174 is spaced from the switching source electrode 173 and is coupled to the first capacitor plate 158.

The driving TFT 20 applies driving power to a pixel electrode 211 for light emission of a light emitting layer 212 of the OLED 210 in a selected pixel. The driving gate electrode 155 is coupled to the first capacitor plate 158. The driving source electrode 176 and the second capacitor plate 178 are each coupled to the common power line 172. The driving drain electrode 177 is coupled to the pixel electrode 211 of the OLED 210 through a contact opening (e.g., a contact hole).

With the above-described structure, the switching TFT 10 is operated by a gate voltage applied to the gate line 151, and functions to transmit a data voltage applied to the data line 171 to the driving TFT 20. A voltage equivalent to a differential between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20, so that the OLED 210 emits light.

A planarization layer 165 may be configured to cover the data wire patterned on the same layer as the data line 171, the common power line 172, the source electrodes 173 and 176, the drain electrodes 174 and 177, the second capacitor plate 178, and the like that are disposed on the interlayer insulating layer 160.

The planarization layer 165 may serve to planarize a surface of the OLED 210 by eliminating or reducing steps so as to increase light emission efficiency of the OLED 210 that will be located on the planarization layer 180. The planarization layer 165 may be made of at least one selected from a polyacrylate resin, an epoxy resin, a phenolic resin, a polyamide resin, a polyimide resin, an unsaturated polyester resin, a polyphenylenether resin, a polyphenylene sulfide resin, and/or benzocyclobutene (BCB).

The pixel electrode 211 of the OLED 210 is located on the planarization layer 165. The pixel electrode 211 is coupled to the drain electrode 177 through the contact opening of the planarization layer 165.

A pixel defining layer (PDL) 190 configured to define a pixel area by exposing at least a part of the pixel electrode 211 is located on the planarization layer 165. That is, the pixel electrode 211 is located to correspond to a pixel area defined by the PDL 190. The PDL 190 may be made of a polyacrylate resin or a polyimide resin.

The light emitting layer 212 is disposed on the pixel electrode 211 in the pixel area and a common electrode 213 is disposed on the PDL 190 and the light emitting layer 212. The light emitting layer 212 may include a low molecular weight organic material or a high molecular weight organic material. At least one of a hole injection layer (HIL) and/or a hole transporting layer (HTL) may be disposed between the pixel electrode 211 and the light emitting layer 212, and at least one of an electron transporting layer (ETL) and/or an electron injection layer (EIL) may be disposed between the light emitting layer 212 and the common electrode 213.

The pixel electrode 211 and the common electrode 213 may be any one of a transmissive electrode, a transflective electrode, and/or a reflective electrode.

A transparent conductive oxide (TCO) may be used to form the transmissive electrode. Examples of the TCO may include indium tin oxide (ITO), indium zinc oxide (IZO), zinc oxide (ZnO), and/or indium oxide ($In_2O_3$).

A metal such as magnesium (Mg), silver (Ag), gold (Au), calcium (Ca), Lithium (Li), Chromium (Cr), aluminum (Al), and copper (Cu), or alloys thereof may be used to form the transflective electrode and the reflective electrode. In this case, the transflective electrode and the reflective electrode may be determined by thickness. In general, the transflective electrode has a thickness of about 200 nm or less and the reflective electrode has a thickness of about 300 nm or greater. As the thickness of the transflective electrode becomes smaller, light transmittance increases, but resistance also increases. In contrast, as the thickness of the transflective electrode becomes larger, light transmittance decreases.

The transflective electrode and the reflective electrode may have a multilayer structure that includes a metal layer made of a metal or an alloy thereof and a transparent conductive oxide layer laminated on the metal layer.

According to one embodiment, the display substrate 100 may have a dual emission structure, and thus light may be emitted in directions of the pixel electrode 211 and the common electrode 213 so that an image is displayed. Therefore, the pixel electrode 211 and the common electrode 213 may be made of a transparent layer or a transflective layer.

A thin film encapsulation layer 250 may be disposed on the common electrode 213. The thin film encapsulation layer 250 may include one or more inorganic layers 251, 253, and 255 and one or more organic layers 252 and 254. Further, the thin film encapsulation layer 250 may have a laminated structure in which the inorganic layers 251, 253, and 255 and the organic layers 252 and 254 are alternately laminated. In this case, the inorganic layer 251 may be the lowermost layer. That is, the inorganic layer 251 may be located to be the closest to the OLED 210. Although the thin film encapsulation layer 250 includes three inorganic layers 251, 253, and 255 and two organic layers 252 and 254 in FIG. 4, embodiments of the present invention are not limited to this structure.

The inorganic layers 251, 253, and 255 are formed of one or more inorganic substances selected from $Al_2O_3$, $TiO_2$, ZrO, $SiO_2$, AlON, AlN, SiON, $Si_3N_4$, ZnO, and/or $Ta_2O_5$. The inorganic layers 251, 253, and 255 are formed by utilizing a chemical vapor deposition (CVD) method or an atomic layer deposition (ALD) method. However, embodiments of the present invention are not limited to these methods. The inorganic layers 251, 253, and 255 may be formed by utilizing many different suitable methods which are known to those skilled in the art.

The organic layers 252 and 254 may be made of a polymer material. Examples of the polymer material include acrylic resin, epoxy resin, polyimide, polyethylene, and the like. The organic layers 252 and 254 may be formed through a thermal deposition process. The thermal deposition process for forming the organic layers 252 and 254 may be performed at a suitable temperature at which the OLED 210 is not likely to be damaged. However, embodiments of the present invention are not limited thereto, and the organic layers 252 and 254 may be formed by utilizing many different suitable methods known to those skilled in the art.

The inorganic layers 251, 253, and 255, which have high density, may suppress the infiltration of moisture or oxygen. The infiltration of moisture or oxygen into the OLED 210 is reduced (or prevented) by the inorganic layers 251, 253, and 255.

The thin film encapsulation layer 250 may have a thickness of 10 μm or less. Accordingly, the display substrate 100 can be formed to be small in its total thickness. With the thin film encapsulation layer 250 applied to the display substrate 100, flexibility of the display substrate 100 can be increased.

A touch screen panel 500 may be disposed on the thin film encapsulation layer 250. Touch input may be detected by the touch screen panel 500 whether or not a touch is input (e.g., presence) and where the touch is input (e.g., location). For instance, a user may use the touch screen panel 500 utilizing a stylus pen (or the user's finger).

Figure 6:
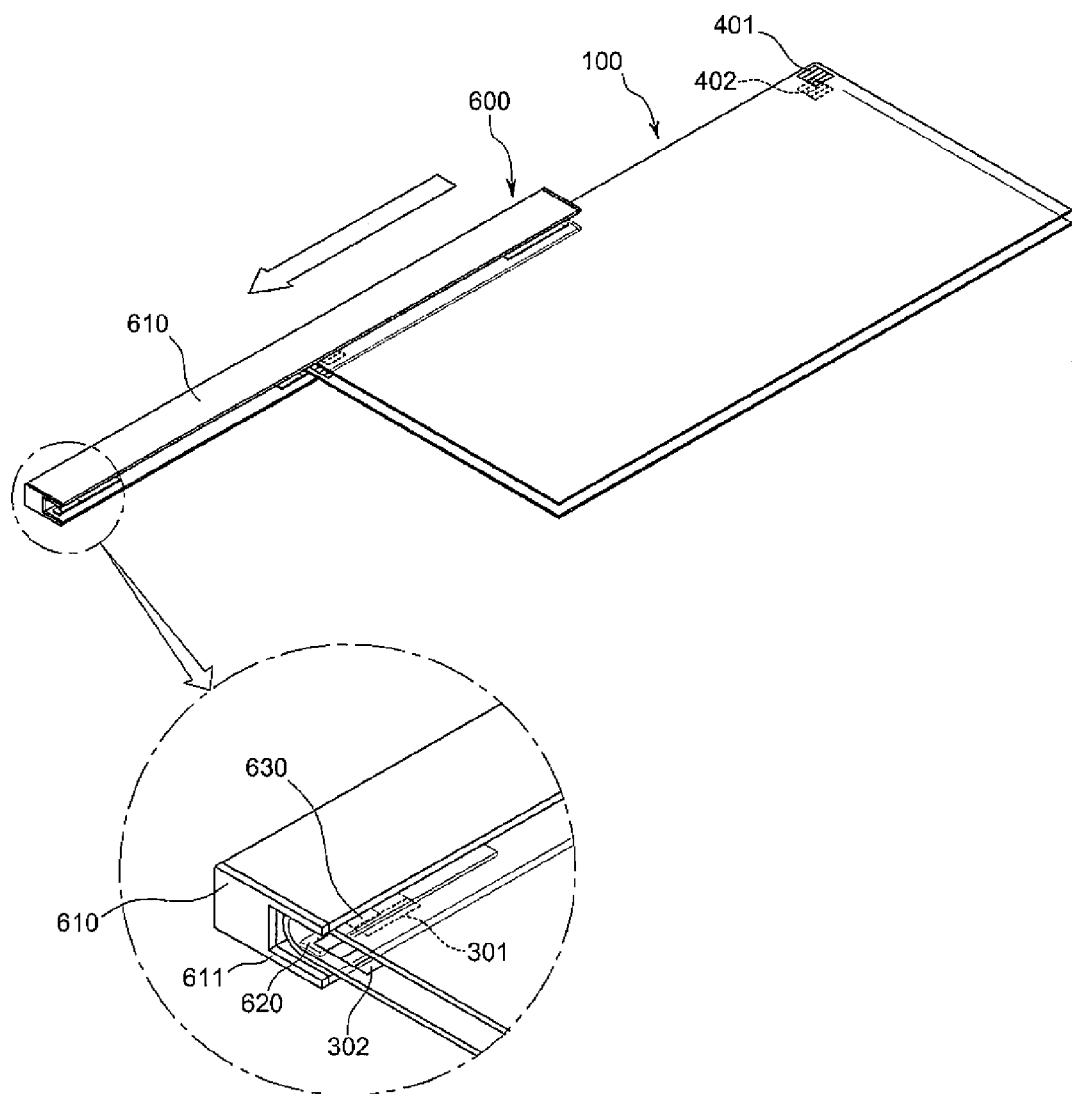
FIGS. 6 and 7 are perspective views illustrating a driving unit coupled to a display substrate according to one embodiment of the present invention.
Figure 7:
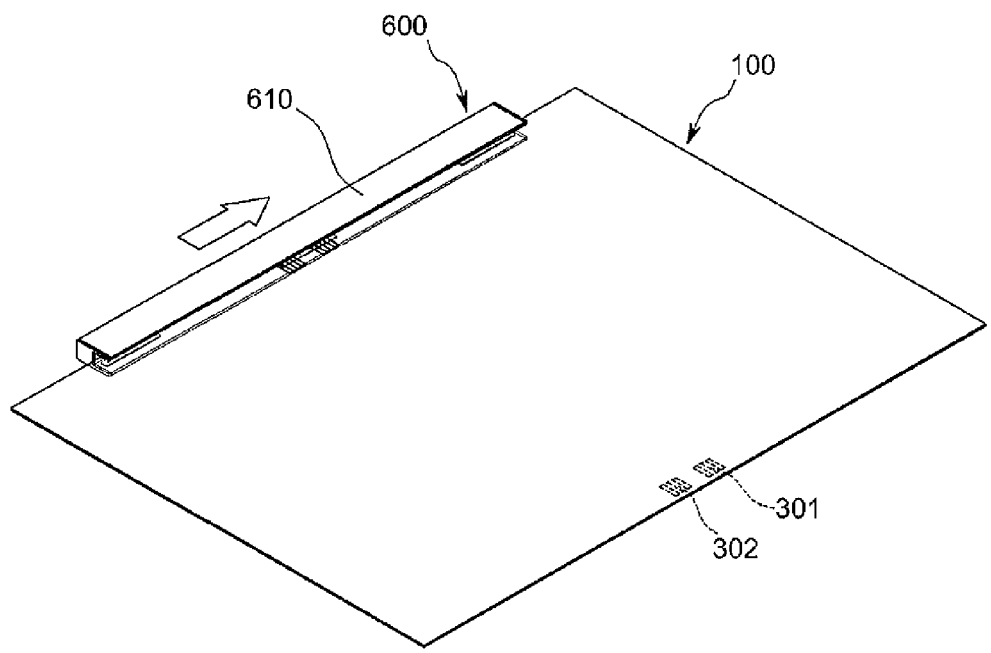

FIGS. 6 and 7 are perspective views illustrating a driving unit coupled to a display substrate according to one embodiment of the present invention.

Referring to FIGS. 6 and 7, the driving unit (or driver) 600 according to one embodiment may include a body 610 mechanically coupled to the display substrate 100, a data driver integrated circuit 620 disposed in the body 610 and configured to supply a plurality of signals and voltages to drive the display substrate 100, and a connector 630 configured to electrically couple the data driver integrated circuit 620 and the pad units 301, 302, 401, and 402.

The body 610 may have the same length as one side of the display substrate 100. According to one embodiment, a length of the body 610 may be equal to that of a short side of the display substrate 100.

The body 610 may include a coupling portion 611 configured to couple the body 610 to the display substrate 100. According to one embodiment, the coupling portion 611 may be a slot type. As illustrated in FIGS. 6 and 7, the display substrate 100 may be slidably fitted into the coupling portion 611 with directionality. The display substrate 100 may also be press-fitted into the coupling portion 611.

The display substrate 100 may be coupled to the body 610 in a folded state (see FIG. 6), or may be coupled to the body 610 in an unfolded state (see FIG. 7). In one embodiment, the pad units 301, 302, 401, and 402 disposed on the display substrate 100 may be electrically coupled to the connector 630 provided in the body 610.

In the case where the display substrate 100 is coupled to the body 610 in a folded state, it may be easy to carry the display substrate 100 because the area of the display substrate 100 is reduced. In contrast, when the display substrate 100 is coupled to the body 610 in an unfolded state, it may be used as a large-area display device.

Referring to FIG. 6, when the display substrate 100 is coupled to the coupling portion 611 in a folded state, the pad units 401 and 402 on the display substrate 100 may be coupled to any one of the connectors 630 on both end portions of the coupling portion 611. Referring to FIG. 7, when the display substrate 100 is coupled to the coupling portion 611 in an unfolded state, the pad units 401 and 402 on the display substrate 100 may be coupled to the connector 630 at a central portion of the coupling portion 611.

Figure 8:
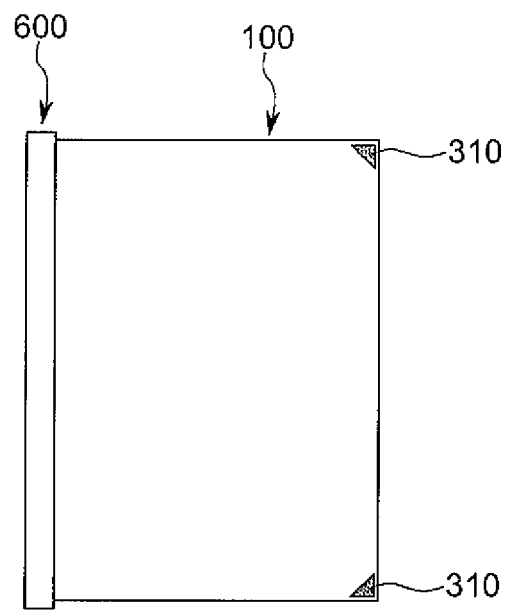
FIG. 8 is a plan view illustrating a motion sensor provided with a display substrate according to one embodiment of the present invention.
Figure 8:
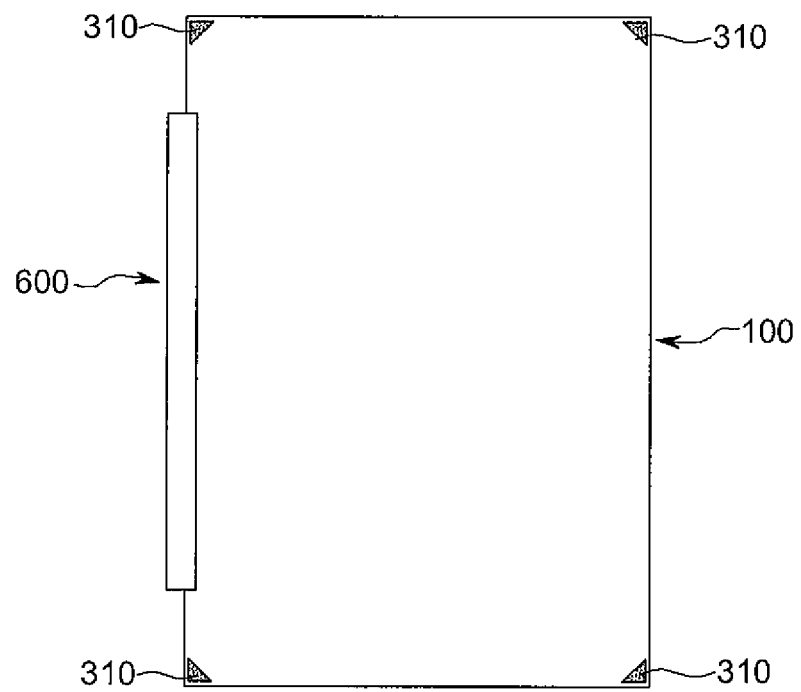

FIG. 8 is a plan view illustrating a motion sensor provided with a display substrate according to one embodiment of the present invention.

Referring to FIG. 8, the display substrate 100 according to one embodiment includes a motion sensor 310. The motion sensor 310 may be configured to detect a motion of an area (e.g., a predetermined area) of the display substrate 100 and process the detected motion into an electrical signal. For example, the motion sensor 310 may be a bending motion sensor that can sense whether or not an area (e.g., a predetermined area) of the display substrate 100 is bent.

The motion sensor 310 may be disposed at at least one edge portion of the display substrate 100. When a user bends an edge portion of the display substrate 100 having flexibility, the motion sensor 310 may sense the bending motion and convert it into an electrical signal. Thus, various motions of the display substrate 100 may be controlled by using the motion sensor 310.

FIGS. 9, 10, 11, 12, 13, and 14 are views illustrating applications of a display device according to one embodiment of the present invention.

Figure 9:
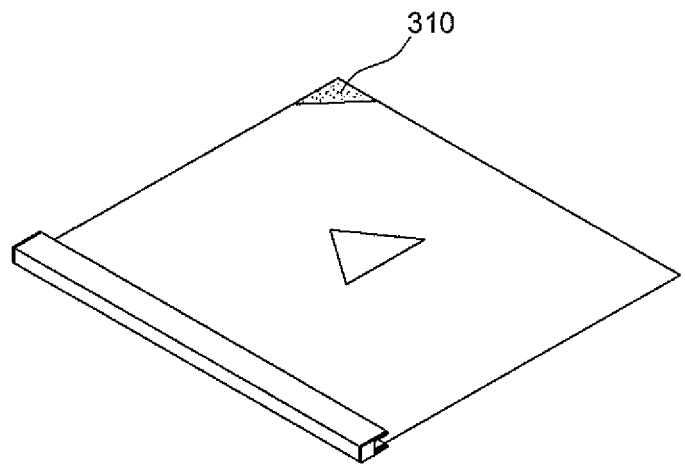
FIGS. 9, 10, 11, 12, 13 and 14 are views illustrating applications of a display device according to one embodiment of the present invention.
Figure 9:
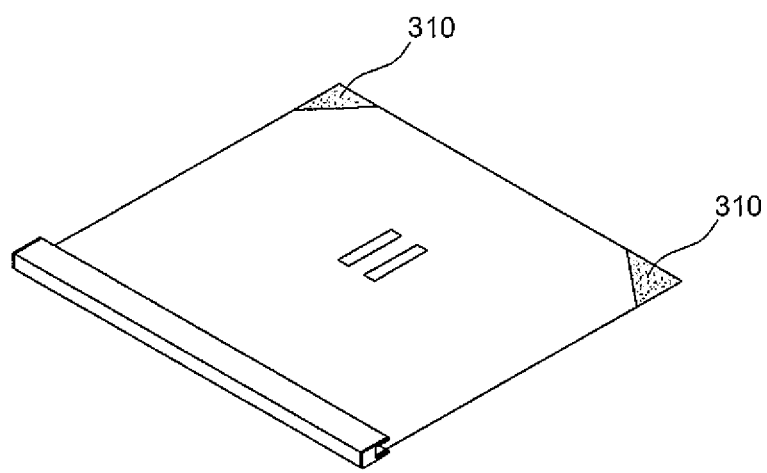
Figure 9:
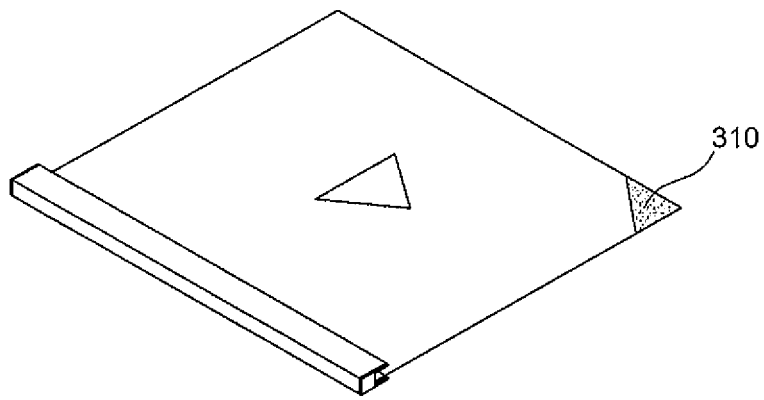

Referring to FIG. 9, a display device according to one embodiment displays an image only in a desired area, thereby decreasing (e.g., minimizing) driving power. For instance, first and second areas are designated in a display area and an image is displayed only in a corresponding area. Such a driving method separates the display area physically, which results in a screen effect of images that appear to overlap, and thus the sense of space with three dimensional effect may occur.

Further, the display substrate 100 may be coupled to the driving unit 600 while being in a folded state so as to be used as a folder type. The folder type display substrate 100 can carry paper documents therebetween. The paper documents may be inserted into the folder type display substrate 100, and then texts and drawings thereof only may appear on a screen, thereby decreasing (e.g., minimizing) power consumption and increasing readability of the texts.

Figure 10:
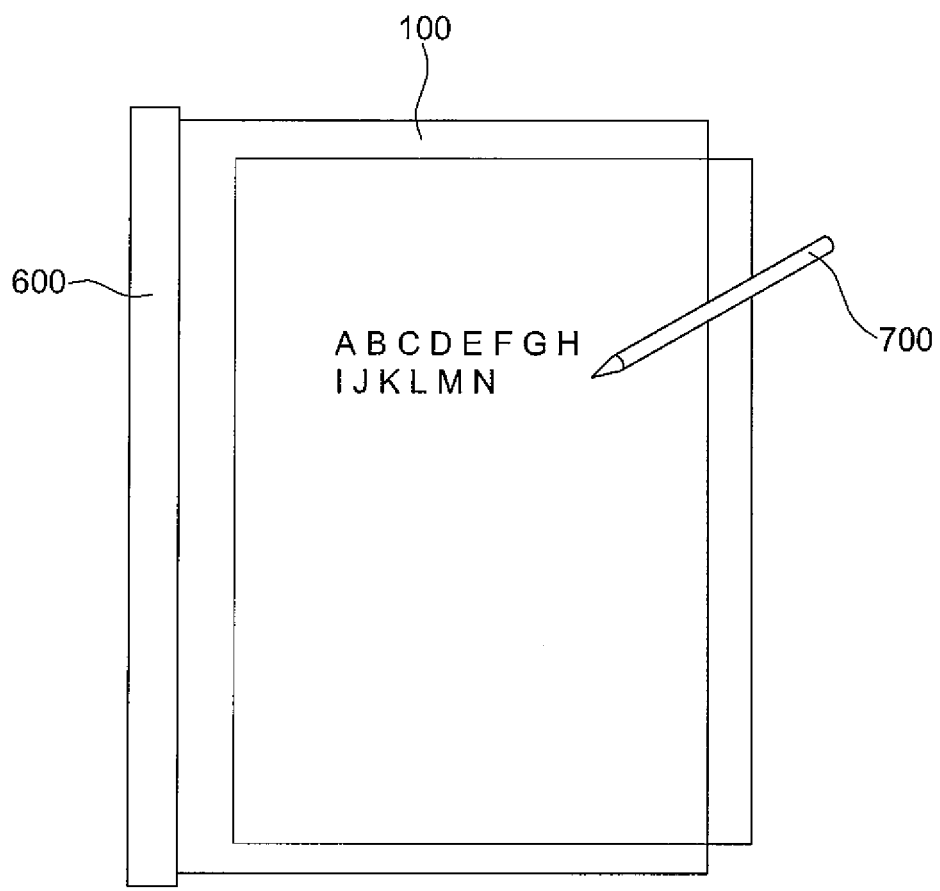

Referring to FIG. 10, a display device according to an embodiment is used for playing multimedia including a combination of audio, video, or other content forms, real-time games, and web browsers (back and forward buttons to go back to the previous resource and forward, respectively) by using motion sensors disposed at each edge portion of the display substrate 100.

For example, multimedia may be played or paused through a bending motion of both edge portions of the display substrate 100, and may also be moved back or forward through a bending motion of the left or right edge portion. The multimedia may also rewind or fast forward through two swift bending motions of the left or right edge portion. These examples are intended for illustrative purposes only, and other various applications are also possible.

Figure 11:
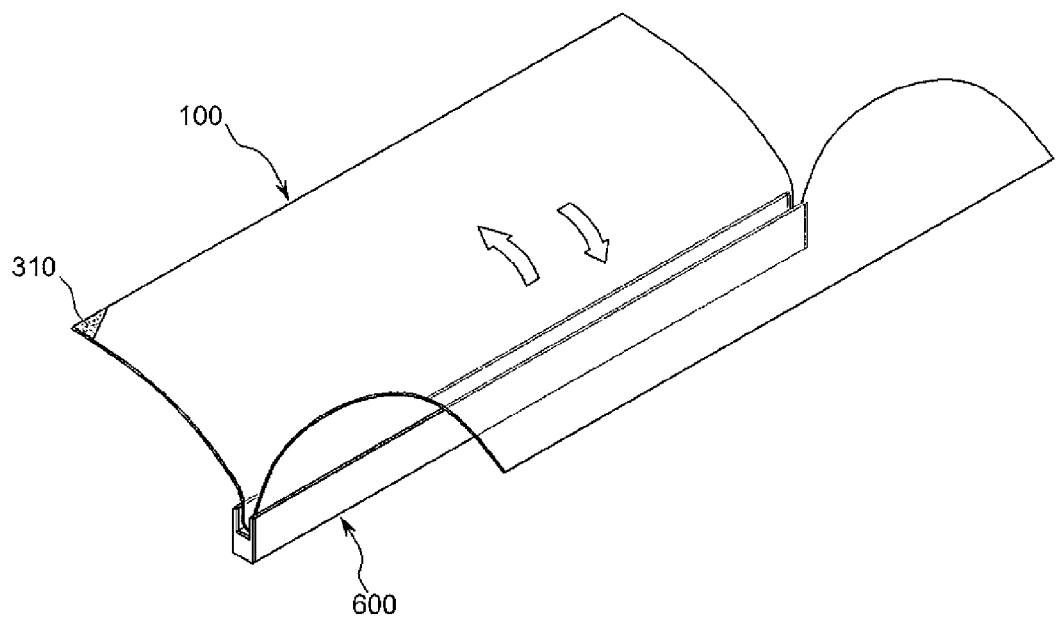

Referring to FIG. 11, a display device according to an embodiment is utilized in a folded state so as to display contents such as newspapers or magazines. The display substrate 100 may perform its analog function such as turning pages through folding and unfolding motions of one side edge portion of the display substrate 100. In addition, the display substrate 100 may perform functions like going back and forward.

Figure 12:
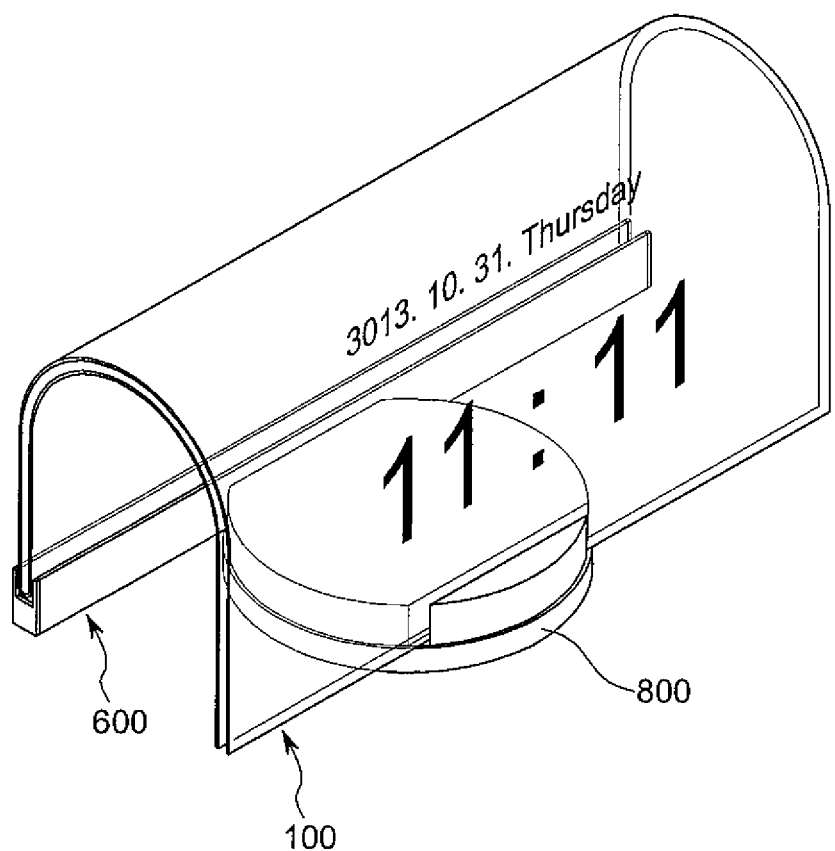

Referring to FIG. 12, a display device according to an embodiment further includes a docking station 800. The docking station 800 may be detachable from the driving unit 600. The docking station 800 may be used to charge the driving unit 600.

The docking station 800 may be coupled to at least one side of the display substrate 100. For example, as illustrated in FIG. 12, the display substrate 100 may be bent at its one side so as to be coupled to the docking station 800.

In addition, the display substrate 100 may be applied to an alarm clock, weather information, calendar, scheduler, photo album, stand lamps, and the like by using the docking station 800. For instance, the display substrate 100, which is bent, may be lightly touched on its upper portion so as to turn off an alarm, and the display substrate 100 may be turned on or off for stand functions. In one embodiment, a display device can be turned on or off by using an edge sensor.

Figure 13:
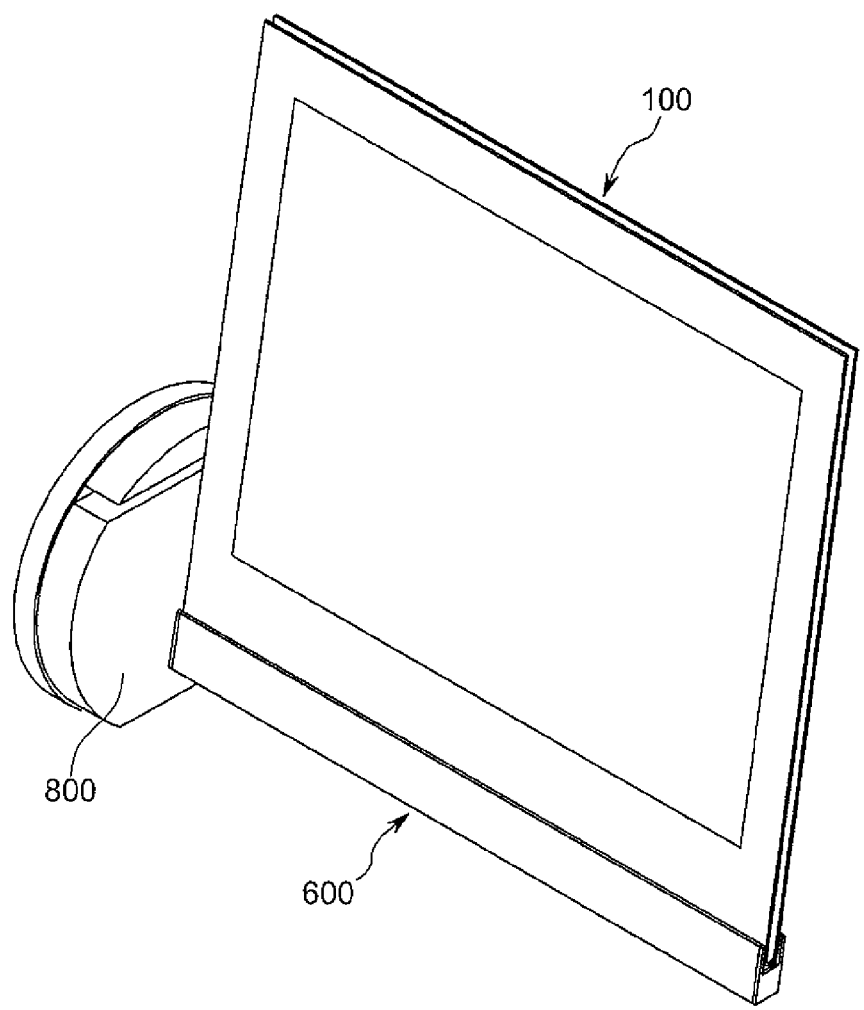

Referring to FIG. 13, the docking station 800 is provided and the display substrate 100 is then coupled to the driving unit 600 so as to be applied for playing multimedia and video chat.

Figure 14:
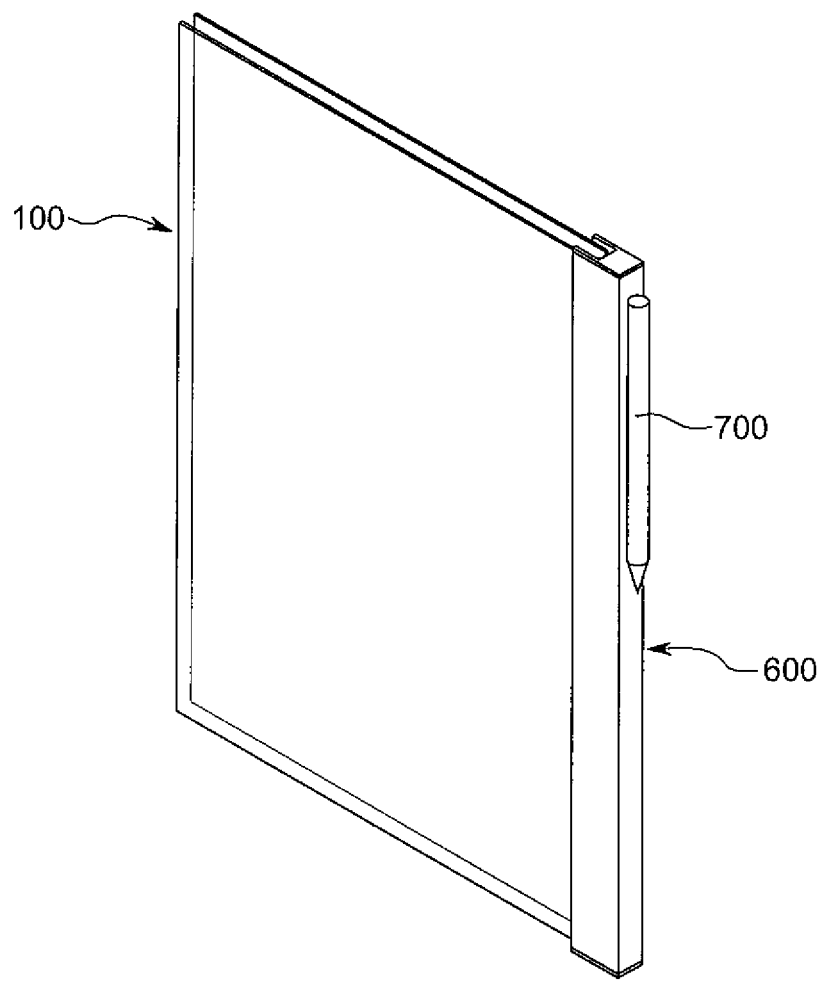

Referring to FIG. 14, a display device according to an embodiment includes a stylus pen 700 that is externally mounted. The stylus pen 700 may be detachable from the driving unit 600 using a magnet for example. The stylus pen 700 may also be fixed to the display substrate 100 using a clip for example.

Figure 15:
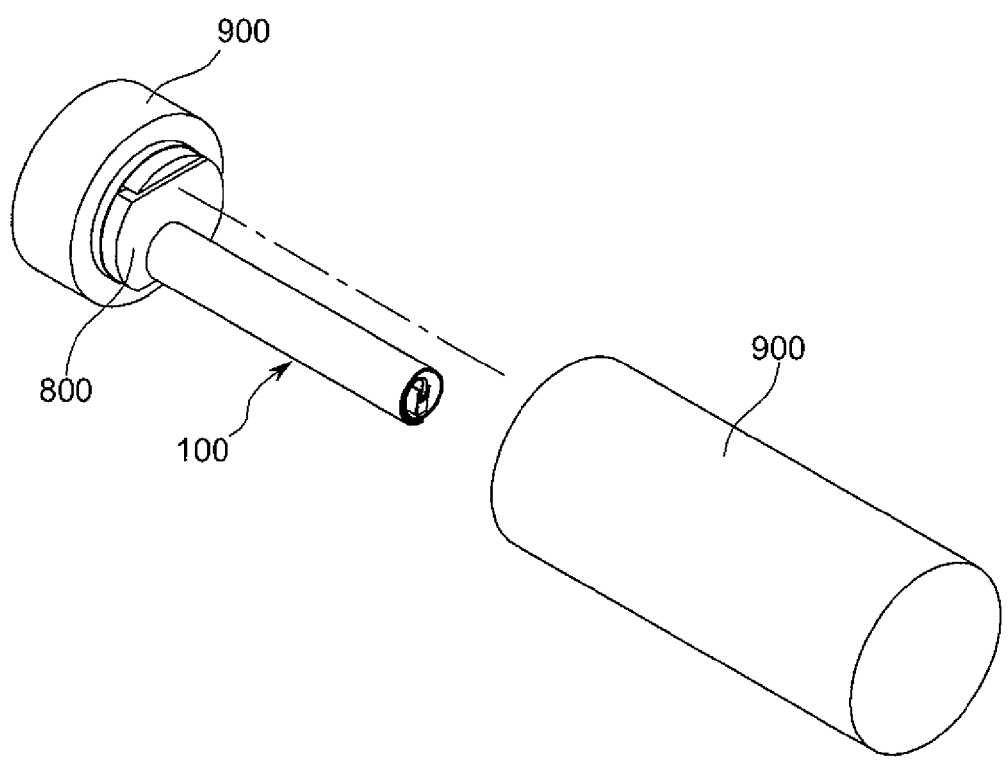
FIG. 15 is a perspective view illustrating a carrying case including a display device according to one embodiment of the present invention.

FIG. 15 is a perspective view illustrating a carrying case including a display device according to one embodiment.

Referring to FIG. 15, a carrying case 900 may be configured to protect a display device from external impacts or environmental conditions. The carrying case 900 may be made of a metal or plastic. The carrying case 900 may have a cylindrical shape in order to roll the docking station 800 and the display substrate 100 and put them into the carrying case 900. The carrying case 900 can be shown as having the aesthetic sense and product identity with its cylindrical shape.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A display device comprising:
a display substrate configured to be folded along a folding line;
a driver detachably coupled to the display substrate; and
a pad on at least one surface of the display substrate, the pad being configured to transmit a plurality of signals received from the driver to the display substrate,
wherein the driver comprises an integrated circuit configured to supply the signals, a coupling portion configured to couple the driver to the display substrate, and a connector configured to couple the pad and the integrated circuit to each other, and
wherein the connector is at a central portion of the coupling portion.

2. The display device of claim 1, wherein the pad comprises pads on respective surfaces of the display substrate.

3. The display device of claim 1, wherein the pad is at a vicinity of the folding line of the display substrate.

4. The display device of claim 1, wherein the connector is at at least one end portion of the coupling portion.

5. The display device of claim 4, wherein the display substrate is configured to be folded along the folding line so as to be coupled to the coupling portion.

6. The display device of claim 5, wherein the pad is coupled to the connector at an end portion of the coupling portion when the display substrate is coupled to the coupling portion while being in a folded state.

7. The display device of claim 1, wherein the pad is coupled to the connector at a central portion of the coupling portion when the display substrate is coupled to the coupling portion while being in an unfolded state.

8. The display device of claim 1, further comprising a motion sensor at at least one edge of the display substrate.

9. The display device of claim 8, wherein the motion sensor comprises a bending motion sensor configured to detect whether or not the display substrate is bent.

10. The display device of claim 1, wherein the display substrate comprises a dual emission structure.

11. The display device of claim 1, wherein the display substrate comprises an organic light emitting diode.

12. The display device of claim 1, wherein the driver further comprises at least one of an on/off switch, a camera, a communication device, a speaker, or an earphone hole.

13. The display device of claim 1, further comprising, a stylus pen configured to be detached from the driver.

14. The display device of claim 1, wherein the folding line is at a central portion of the display substrate.

15. The display device of claim 1, further comprising a docking station configured to detach from the driver and configured to charge the driver.

16. The display device of claim 15, wherein the docking station is coupled to at least one side of the display substrate.

17. The display device of claim 15, further comprising a carrying case coupled to the docking station.

18. The display device of claim 17, wherein the display substrate is configured to be inserted into the carrying case.

* * * * *